United States Patent
Sanders et al.

(10) Patent No.: US 10,217,691 B2
(45) Date of Patent: Feb. 26, 2019

(54) HEAT SPREADER WITH OPTIMIZED COEFFICIENT OF THERMAL EXPANSION AND/OR HEAT TRANSFER

(71) Applicant: nLIGHT, Inc., Vancouver, WA (US)

(72) Inventors: Walter R. Sanders, Vancouver, WA (US); Manoj Kanskar, Portland, OR (US)

(73) Assignee: NLIGHT, Inc., Vancouver, WA (US)

( * ) Notice: Subject to any disclaimer, the term of this patent is extended or adjusted under 35 U.S.C. 154(b) by 4 days.

(21) Appl. No.: 15/238,192

(22) Filed: Aug. 16, 2016

(65) Prior Publication Data

US 2017/0055365 A1    Feb. 23, 2017

Related U.S. Application Data

(60) Provisional application No. 62/205,853, filed on Aug. 17, 2015.

(51) Int. Cl.
*H01L 23/373* (2006.01)
*H01S 5/024* (2006.01)
*H01L 23/36* (2006.01)

(52) U.S. Cl.
CPC ........... *H01L 23/373* (2013.01); *H01L 23/36* (2013.01); *H01S 5/02476* (2013.01)

(58) Field of Classification Search
CPC . H01L 2224/32225; H01L 2924/00012; H01L 2224/48091; H01L 2224/48227; H01L 2924/0002; H01L 2224/73265; H01L 2924/181; H01L 2924/15311; H01L 2924/351; H01L 23/373; H01L 23/36; G02B 6/4204; G02B 6/3865; H01S 3/042; H01S 3/08072; H01S 3/09415; H01S 5/02272; H01S 5/02476; H01S 3/0405

See application file for complete search history.

(56) References Cited

U.S. PATENT DOCUMENTS

| | | | | |
|---|---|---|---|---|
| 5,028,106 | A * | 7/1991 | Hockaday | G02B 6/122 385/14 |
| 5,420,472 | A * | 5/1995 | Cho | H03H 9/02551 310/313 R |
| 5,577,060 | A * | 11/1996 | Nighan, Jr. | H01S 3/09415 372/106 |
| 6,027,590 | A * | 2/2000 | Sylvester | H01L 23/145 156/150 |

(Continued)

OTHER PUBLICATIONS

International Search Report and Written Opinion for PCT/US2016/047208, dated Oct. 28, 2016, 12 pages.

*Primary Examiner* — Adam B Dravininkas
(74) *Attorney, Agent, or Firm* — Michelle Craig

(57) ABSTRACT

Methods, systems and an apparatus relating to a heat spreader to be coupled to a heat source having a heat source coefficient of thermal expansion (HS CTE), the heat spreader comprising an anisotropic material having a high expansion axis. The heat spreader also including a surface to be coupled to the heat source, wherein the high expansion axis of the anisotropic material is oblique to the surface of the heat spreader and wherein the high expansion axis of the anisotropic material is oriented at a first angle of rotation about a first axis of the heat spreader wherein the first angle of rotation is selected to optimize a match of a first CTE of the heat spreader with the HS CTE.

21 Claims, 13 Drawing Sheets

(56) References Cited

U.S. PATENT DOCUMENTS

| | | | |
|---|---|---|---|
| 6,104,090 A | | 8/2000 | Unger et al. |
| 6,160,663 A | | 12/2000 | Merrill et al. |
| 6,292,367 B1 | * | 9/2001 | Sikka ................... H01L 23/3731 165/185 |
| 6,793,009 B1 | * | 9/2004 | Sarraf ..................... F28D 15/02 165/104.26 |
| 6,933,531 B1 | * | 8/2005 | Ishikawa ................ B22F 3/14 257/76 |
| 2002/0041959 A1 | * | 4/2002 | Kawai ................... C22C 32/00 428/375 |
| 2004/0057480 A1 | * | 3/2004 | Sumida ................... H01S 3/042 372/39 |
| 2006/0043579 A1 | * | 3/2006 | He .................. H01L 21/823807 257/712 |
| 2006/0113546 A1 | | 6/2006 | Sung |
| 2008/0054076 A1 | * | 3/2008 | Schleuning ......... H01S 5/02288 235/462.35 |
| 2010/0012354 A1 | * | 1/2010 | Hedin ................... H05K 1/0313 174/252 |
| 2010/0177796 A1 | | 7/2010 | Miller |
| 2011/0316038 A1 | * | 12/2011 | Hirotsuru ............. C04B 41/009 257/99 |
| 2012/0012995 A1 | | 1/2012 | Kuroda et al. |
| 2012/0161325 A1 | * | 6/2012 | McConnelee ......... H01L 21/486 257/760 |
| 2012/0206882 A1 | * | 8/2012 | Mohammed .......... H01L 23/373 361/710 |
| 2013/0083583 A1 | * | 4/2013 | Crisp ..................... H01L 23/13 365/63 |
| 2015/0229096 A1 | * | 8/2015 | Akino ................... H01S 3/0941 372/36 |

* cited by examiner

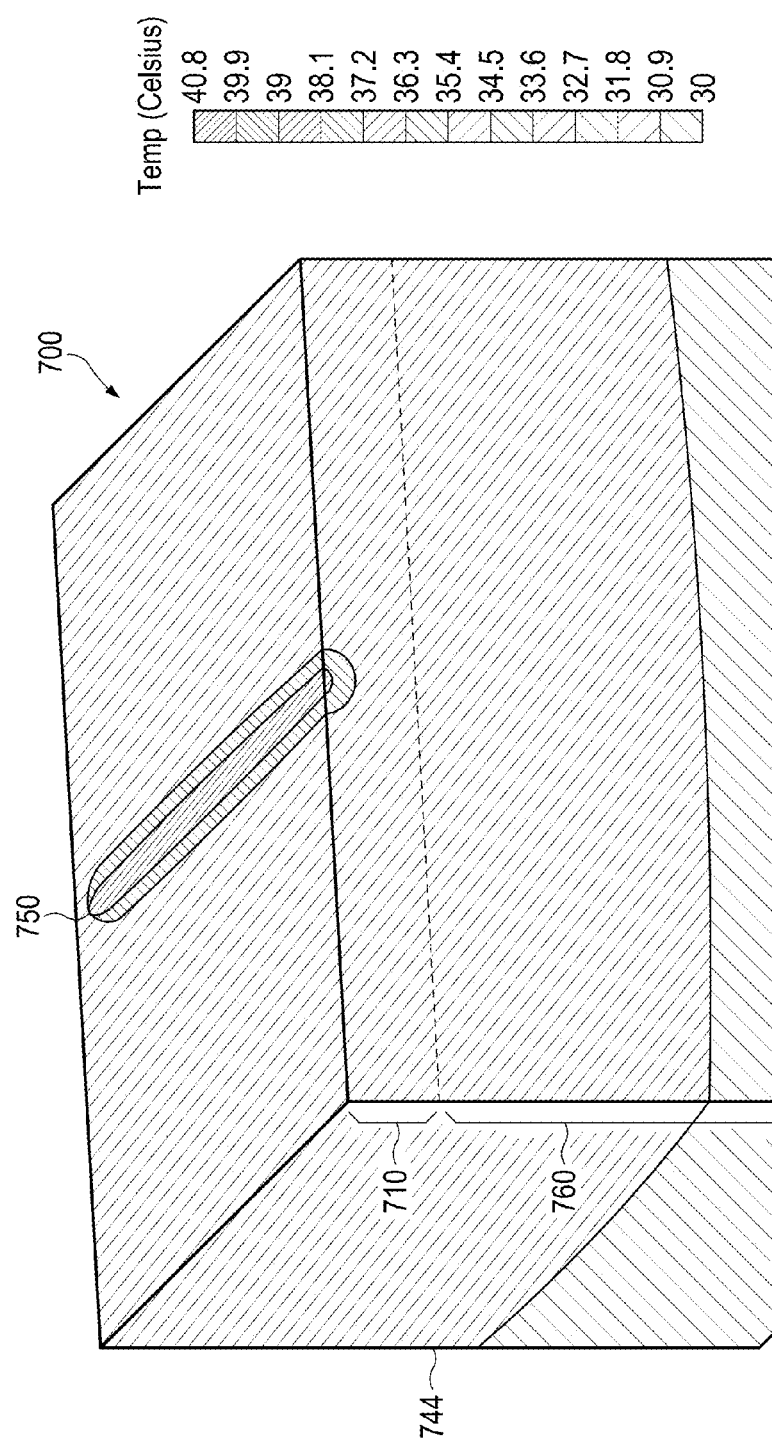

HEAT SPREADER WITH OPTIMIZED COEFFICIENT OF THERMAL EXPANSION AND/OR HEAT TRANSFER

CROSS-REFERENCE TO RELATED APPLICATION

This application claims the benefit of U.S. Provisional Patent Application No. 62/205,853, filed Aug. 17, 2015, which is incorporated herein by reference for all purposes.

TECHNICAL FIELD

Generally, the field of the presently disclosed technology is semiconductor packaging. More particularly, the disclosed technology relates to matching a coefficient of thermal expansion of material used in packaging with the coefficient of thermal expansion of a heat source.

BACKGROUND

Semiconductor devices are fragile and typically assembled in a package to protect the device from damage due to thermal and mechanical stress, corrosion, contamination, and etc. Semiconductor packaging typically includes heat dissipation components such as heat dissipation layers, heat spreaders and/or heat sinks.

Laser diodes are a type of semiconductor device. In gallium arsenide (GaAs) and indium phosphide (InP) based laser packages, the lasers grown on GaAs and InP are bonded onto CTE-matched submounts to dissipate heat. Such submounts are typically made of aluminum nitride (AlN), and/or beryllium oxide (BeO). However, these materials have poorer thermal conductivity compared to silicon carbide (SiC), copper (Cu), cubic boron nitride (c-BN), graphite, graphene, graphene-composites, carbon nanotubes, carbon nanotube composites, diamond and encapsulated pyrolytic graphite. Use of aforementioned higher thermal conductivity materials have distinct performance advantages; however, CTE-mismatched submounts may lead to compromise in reliability of semiconductor devices.

In order to take advantage of the higher thermal conductivity of materials such as SiC, Cu, cubic BN, graphite, graphene, diamond and encapsulated pyrolytic graphite pairing of a CTE mis-matched heat spreader with a heat source such as a semiconductor device may require additional measures to reduce transfer of mechanical stress from the highly thermally conductive material to the heat source due to the CTE mis-match. Such measures may be unreliable and the time and cost of implementing measures to reduce mechanical stress may be prohibitive.

SUMMARY

What is needed is a highly thermally conductive material that has a substantially similar CTE as the heat source for use in electronics packaging. In an example, it is desirable that the highly thermally conductive material also has the required electrical isolation properties. It would also be advantageous to be able to tune the highly thermally conductive material to match the CTE of a heat source while substantially maintaining thermally conductive properties of the material.

Disclosed herein are examples of a heat spreader having a heat source coefficient of thermal expansion (HS CTE), the heat spreader comprising an anisotropic material having a high expansion axis, a surface of the heat spreader to be coupled to a heat source, wherein the high expansion axis of the anisotropic material may be oblique to the surface of the heat spreader and wherein the high expansion axis of the anisotropic material may be oriented at a first angle of rotation about a first axis of the heat spreader wherein the first angle of rotation may be selected to optimize a match of a first CTE of the heat spreader with the HS CTE. The high expansion axis of the anisotropic material may be oriented at a second angle of rotation about a second axis of the heat spreader wherein the second angle of rotation may be selected to optimize the match of the first CTE of the heat spreader with the HS CTE. Further, the anisotropic material may be oriented within the heat spreader such that high expansion axis may be rotated through a third angle of rotation about a third axis of the heat spreader wherein the third angle of rotation may be selected to optimize the match of the first CTE of the heat spreader with the HS CTE. The first angle of rotation, the second angle of rotation or the third angle of rotation or a combination thereof may optimize thermal conductivity of the heat spreader subordinate to optimizing the match of the first CTE of the heat spreader with the HS CTE. The first angle of rotation, the second angle of rotation or the third angle of rotation or a combination thereof may optimize a match of the first CTE or a second CTE of the heat spreader with respective ones of a first CTE along a first HS axis of the heat source or a second CTE along a second HS axis of the heat source or a combination thereof. The first angle of rotation, the second angle of rotation or the third angle of rotation or a combination thereof may optimize thermal conductivity of the heat spreader subordinate to matching the first CTE along a first HS axis of the heat source or a second CTE along a second HS axis of the heat source or a combination thereof. The heat spreader may be substantially may be otropic based on orientation of the anisotropic material. The anisotropic material may comprise at least one of silicon carbide (SiC), copper (Cu), cubic boron nitride (c-BN), graphite, graphene, graphene-composites, carbon nanotubes, carbon nanotube composites, diamond and pyrolytic graphite. The heat spreader may be coupled to the heat source at the surface and a heat sink at a surface opposite the heat source.

Disclosed herein are examples of a system comprising a heat source having a coefficient of linear thermal expansion (CTE), a heat spreader to be coupled to the heat source comprising an anisotropic material wherein the anisotropic material includes: a primary axis having a primary coefficient of thermal expansion (CTE) along the primary axis, wherein the primary CTE may be a highest CTE in the anisotropic material, a secondary axis having a secondary CTE along the secondary axis, wherein the secondary axis may be orthogonal to the primary axis and wherein the primary CTE may be different from the secondary CTE and a tertiary axis having a tertiary CTE along the tertiary axis, wherein the tertiary axis may be orthogonal to the secondary axis and the primary axis. A surface of the heat spreader in contact with the heat source may be oriented in a plane oblique to the primary axis. The heat spreader may comprise a quaternary axis orthogonal to the oblique plane having a quaternary CTE along the quaternary axis, a quinary axis in the oblique plane having a quinary CTE along the quinary axis and a senary axis in the oblique plane having a senary CTE along the senary axis, wherein the anisotropic material may be oriented within the heat spreader such that the primary axis may be rotated at a first angle of rotation with respect to the quaternary axis about the quinary axis and wherein the first angle of rotation optimizes a match of the quaternary CTE, quinary CTE or senary CTE or any combinations thereof with a CTE of the heat source. The first angle of rotation may optimize thermal conductivity along the quaternary axis, quinary axis or senary axis, or any combinations thereof subordinate to optimizing the match of the quaternary CTE, quinary CTE or senary CTE or any combinations thereof with the CTE of the heat source. The anisotropic material may be oriented within the heat spreader such that the primary axis may be rotated through a second angle of rotation with respect to the quinary axis about the senary axis and wherein the second angle of rotation may optimize the match of the quaternary CTE, quinary CTE or senary CTE or any combinations thereof with a CTE of the heat source. The second angle of rotation may optimize thermal conductivity along the quaternary axis, quinary axis or senary axis, or any combinations thereof subordinate to optimizing the match of the quaternary CTE, quinary CTE or senary CTE or any combinations thereof with the CTE of the heat source. The anisotropic material may be oriented within the heat spreader such that the primary axis may be rotated through a third angle of rotation with respect to the senary axis about the quaternary axis and wherein the third angle of rotation may optimize the match of the quaternary CTE, quinary CTE or senary CTE or any combinations thereof with a CTE of the heat source. The third angle of rotation may optimize thermal conductivity along the quaternary axis, quinary axis or senary axis, or any combinations thereof subordinate to optimizing the match of the quaternary CTE, quinary CTE or senary CTE or any combinations thereof with the CTE of the heat source. The tertiary CTE may be different from the primary CTE and the secondary CTE. The anisotropic material may comprise at least one of silicon carbide (SiC), copper (Cu), cubic boron nitride (c-BN), graphite, graphene, graphene-composites, carbon nanotubes, carbon nanotube composites, diamond and encapsulated pyrolytic graphite. The heat source may be an laser diode, integrated circuit or a light emitting diode, or any combinations thereof.

Disclosed here is a method for identifying a first coefficient of thermal expansion (CTE) of a heat source in a first axis of the heat source to be coupled to a heat spreader comprising an anisotropic material, selecting a first angle of rotation of a high expansion axis of the anisotropic material to optimize a match of one or more CTEs of one or more anisotropic material axes with the first CTE wherein the angle is with respect to a first axis of the heat spreader and rotating the high expansion axis of the anisotropic material to the first angle of rotation. The method may further include selecting a second angle of rotation of the high expansion axis of the anisotropic material to optimize the match of one or more CTEs of one or more anisotropic material axes with the first CTE wherein the angle is with respect to a second axis of the heat spreader and rotating the high expansion axis of the anisotropic material to the second angle of rotation. The method may also include identifying a second CTE of the heat source in a second axis of the heat source and rotating the high expansion axis of the anisotropic material through a second angle of rotation to optimize matching of the one or more CTEs of one or more anisotropic material axes with the second CTE. The method may additionally include selecting the first angle of rotation to optimize thermal conductivity along one or more axes of the heat spreader subordinate to optimizing the match of the one or more CTEs of one or more anisotropic material axes with the first CTE.

The forgoing and other objects, features, and advantages of the disclosed technology will become more apparent from the following detailed description, which proceeds with reference to the accompanying figures.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

FIG. 7B illustrates a simulated temperature rise of an assembly comprising a submount.

DETAILED DESCRIPTION

Figure 1:
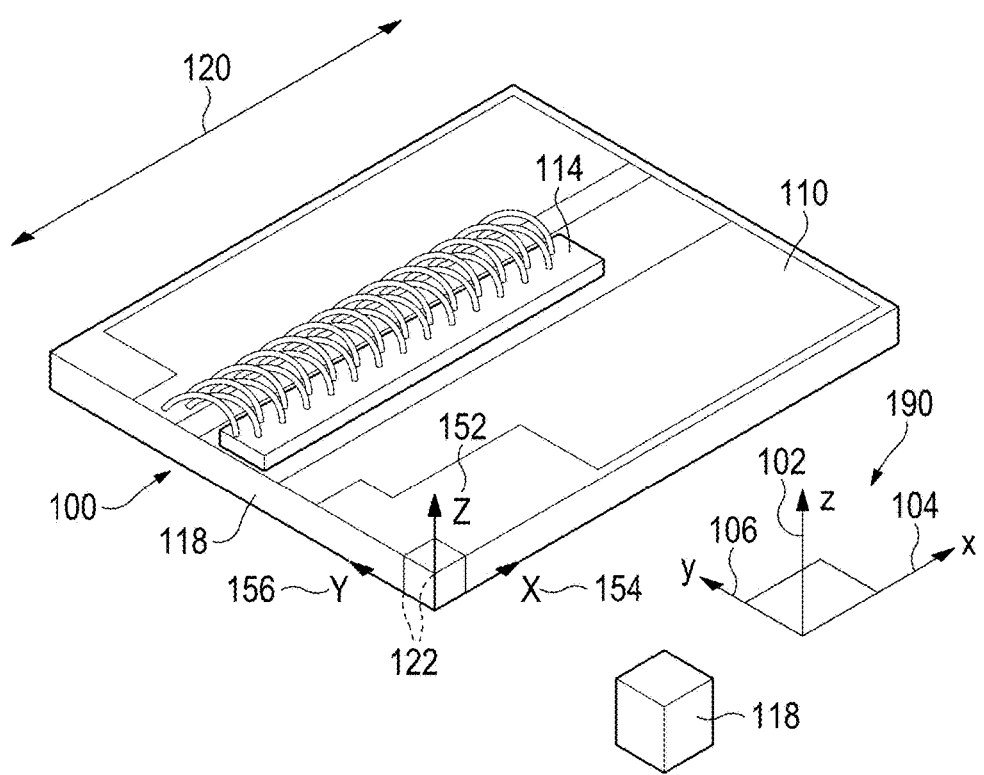
FIG. 1 illustrates an example of a laser diode and submount assembly.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

In general, materials expand and contract in response to temperature change. Material expansion or contraction may occur at different rates in one or more directions. The coefficient of thermal expansion (CTE) is a measure of how much a material expands in size per unit of size and per unit change in temperature where one or more other variables are held constant. There are CTEs for volumetric, area, and linear thermal expansion. In the present description, the coefficient of linear thermal expansion is discussed in various examples. However, a coefficient of area thermal expansion and/or a coefficient of volumetric thermal expansion may be appropriate and applicable depending on materials used and application of the technology described herein.

A heat spreader is a heat exchanger used to cool a heat source by transferring heat away from the heat source. Thermal conductivity is a measure of how well a material conducts heat. The higher the thermal conductivity of a material the greater the rate of heat transfer across the material. Heat spreaders are used to cool a variety of devices and to transfer and/or spread heat to other thermally conductive devices such as heat sinks. A heat spreader may be a substrate or submount to which a heat source is coupled. Semiconductor devices such as integrated circuits, diode lasers, light emitting diodes (LEDs) and the like, or any combinations thereof are often cooled by coupling to a heat spreader. Heat transfer capacity of a heat spreader varies and depends on a number of factors including the thermal conductivity of the heat spreading material and other conductive surfaces in contact with the heat spreader, the method of coupling the heat source to the heat spreader, and/or the amount of surface area of the heat spreader in contact with a cooling medium.

Heat spreaders are often bonded to and/or in direct or close contact with a heat source. Heat sources such as integrated circuits, diode lasers, LEDs and the like, or any combinations thereof are fragile and thus sensitive to mechanical stress. Additionally, such devices tend not to conduct heat particularly well and tend to have lower CTEs. Not surprisingly, the CTE of the heat spreader material can have a significant impact on the reliability of the heat source to which it is coupled because CTE mismatch adds mechanical stress that tends to be transferred to the fragile semiconductor materials.

An assembly including a heat spreader having a particular CTE coupled to a heat source having a lower CTE than the heat spreader may go through multiple heating and cooling cycles during operation. Heating may cause expansion of the heat spreader to a greater extent than the expansion of the heat source thus causing the heat source to deform and/or fracture. Ideally, the CTE of a heat spreader would substantially match the CTE of the heat source. Matching the CTE of a heat spreader to the CTE of a heat source typically comes at a cost in thermal transfer capability of the heat spreader. Conversely, improving thermal performance of a heat spreader by using a more thermally conductive material typically increases CTE mismatch between the heat spreader and the heat source introducing mechanical stress in the assembly.

In some cases, CTE mismatch may be managed by using a soft solder material such as indium between the heat source and the CTE mis-matched heat spreader. However, the disadvantage of using soft solder is that the heat source may become mis-aligned with continued thermal cycling, the solder may run or become brittle and/or soft solder may still transfer mechanical stress from the CTE mis-matched heatsink to the heat source. In another example, a heat spreader may be attached to a heat source by clamping or other non-permanent methods of coupling the heat spreader to the heat source.

Heat spreader materials may comprise thermally conductive materials that are isotropic or anisotropic. Isotropic materials tend to have material properties that are substantially the same along all axes. Thus, isotropic materials expand at about the same rate in all directions. Anisotropic materials have different material properties in at least two different axes. Thus, anisotropic materials expand at different rates in at least two different directions. This discussion pertains to, but is not limited to, materials that are homogeneous and claimed subject matter is not so limited.

In an example, using an anisotropic material as a heat spreader may be advantageous in that many anisotropic materials are very highly thermally conductive in at least one direction (i.e, along at least one axis). The disadvantage of using such a thermally conductive material is that the CTE in one or more axes may be high as well. This will likely lead to a CTE mismatch between the heat spreader and the heat source in at least one axis.

In an example, reorienting the anisotropic material in a heat spreader may enable the heat spreader to dissipate heat away from a heat source efficiently and with a better CTE match. In an example, an axis of the anisotropic material may be reoriented with respect to a surface of the heat spreader and/or one or more axes parallel and/or perpendicular to the surface of the heat spreader such that the reoriented axis of the anisotropic material is oblique to a plane parallel to the surface of the heat spreader. The axis of the anisotropic material may be any axis. For example, an axis having the highest CTE (i.e., the high expansion axis) may be used as the axis to be reoriented. However, it is not necessary to select the high expansion axis for reorientation. Another axis of the anisotropic material may be used. Reorienting the anisotropic material may be accomplished by rotating the selected axis one or more times about one or more axes of the heat spreader. Reorienting the anisotropic material in this way may reduce mechanical stress in the heat source/heat spreader assembly while still taking advantage of the high thermal conductivity of the anisotropic material. Reorienting the anisotropic material may be accomplished in a variety of ways.

FIG. 1 illustrates an example of a laser diode and submount assembly 100. Submount 110 may be coupled to laser diode 114. In an example, submount 110 comprises an anisotropic material 118. Anisotropic material 118 in its natural form may be highly anisotropic in thermal conductivity and coefficient of thermal expansion. Anisotropic material 118 may have the following material properties:

Thermal Conductivity:
  x axis 104=kX=1700.0 W/m-K
  y axis 106=kY=1700.0 W/m-K
  z axis 102=kZ=7.0 W/m-K
Coefficient of Linear Thermal Expansion (CTE):
  x axis 104=$\alpha$x=0.5 E-6 m/m-C
  y axis 106=$\alpha$y=0.5 E-6 m/m-C
  z axis 102=$\alpha$z=25.0 E-6 m/m-C In an example, from an original orientation 190, z axis 102 of anisotropic material 118 is rotated 90° about the Y axis 156 of submount 110. Thus, axes X axis 154, Y axis 156 and Z axis 152 of submount 110 have the following properties:

Thermal Conductivity:
  X axis 154=kX=7 W/m-K
  Y axis 156=kY=1700 W/m-K
  Z axis 102=kZ=1700 W/m-K
Coefficient of Linear Thermal Expansion (CTE):
  X axis 154=$\alpha$X=25.0 E-6 m/m-C
  Y axis 156=$\alpha$Y=0.5 E-6 m/m-C
  Z axis 152=$\alpha$Z=0.5 E-6 m/m-C In representative examples, it may be desirable to take advantage of the high thermal conductivity of Z-Y plane 122 (the x-y plane of anisotropic material 118) in submount 110 and align Z-Y plane 122 perpendicular to a bottom surface of laser diode 114. Z-Y plane 122 may be disposed across a length 120 of laser diode 114 in order to facilitate heat transfer away from laser diode 114, for example during operation. Heat transferred away from laser diode 114 may dissipate through submount 110 to a next conductive interface (not shown) in a laser diode assembly 100. Unfortunately, aligning Z-Y plane 122 of submount 110 along length 120 of laser diode 114 to take advantage of the heat spreading capacity of anisotropic material 118 also aligns the high expansion axis (z axis 102) of anisotropic material 118 parallel to and along the length 120 of laser diode 114 in the X axis 154 direction.

In an example, laser diode 114 may be made of GaAs and anisotropic material 118 may be pyrolytic graphite. In this configuration, submount 110 may transfer significant mechanical stress to laser diode 114 during operation due to the difference between the CTE of submount 110 in the X axis 154 direction and the CTE of laser diode 114 in the X axis 154 direction. Although not perfectly isotropic, GaAs has an approximate CTE of 5.4 E-6 m/m-C and an elastic modulus of approximately 85.0 GPa whereas pyrolytic graphite has a reported elastic modulus less than 50.0 GPa in the z axis or high expansion axis. Submount 110 has a significantly larger cross-sectional area than laser diode 114. Therefore, due to the differences in cross-sectional areas of submount 110 versus laser diode 114, a submount 110 of pyrolytic graphite is still several orders of magnitude stiffer than a GaAs laser diode 114. Thus, a significant portion of mechanical strain in assembly 100 will be absorbed by laser diode 114. Thus, pyrolytic graphite in its natural orientation is impractical for high power diode laser operation.

Figure 2A:
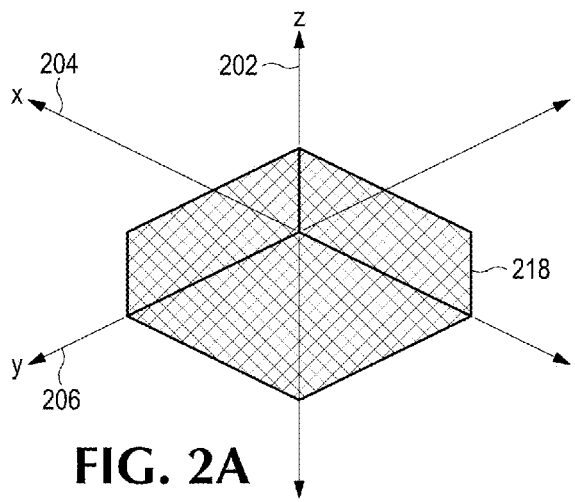
FIG. 2A illustrates an example of an anisotropic (in thermal conductivity and coefficient of thermal expansion) material from which a custom submount may be formed.

In an example, to minimize CTE mismatch and in some cases the mechanical strain absorbed by a heat source one or more of axes x axis 104, y axis 106 or z axis 102 of anisotropic material 118 can be re-oriented with respect to the one or more axes of submount 110 as shown in FIG. 2A.

FIG. 2A illustrates an example of an anisotropic material from which a custom submount may be formed. The submount may be for securing a heat source such as a diode laser or other semiconductor device. Anisotropic material 218 comprises a z axis 202 having a first CTE along the z axis 202, an x axis 204 having a second CTE along the x axis 204, and a y axis 206 having a third CTE along the y axis 206. The z axis 202, x axis 204 and y axis 206 are mutually orthogonal. In one example, the anisotropic material may be orthotropic wherein the first CTE, the second CTE and the third CTE are all different from each other. In another example, the anisotropic material 218 may have the same or similar CTEs in two of the three axes, while the third axis has a different CTE.

The anisotropic material may comprise any of a variety of substances. If the submount to be formed from the anisotropic material 218 is to be coupled to a heat source, the anisotropic material 218 may be selected based on the thermal conductivity, CTE and other physical properties of the heat source to which the submount will be coupled. Some examples of anisotropic materials that can be used in such an application include but are not limited to, silicon carbide (SiC), copper (Cu), cubic boron nitride (c-BN), graphite, graphene, graphene-composites, carbon nanotubes, carbon nanotube composites, diamond and encapsulated pyrolytic graphite BN, or the like or combinations thereof.

In an example, x axis 204 and y axis 206 may have the highest thermal conductivity of anisotropic material 218 and the lowest CTE. Whereas, z axis 202 may have the lowest thermal conductivity of the three axes and may have the greatest CTE. However, in another example, an axis having the highest thermal conductivity may also have the greatest CTE.

In the current example, z axis 202 has the greatest CTE of the anisotropic material 218 axes and is referred to herein as the "high expansion axis" interchangeably with the "z axis" designation. A submount may be formed from anisotropic material 218 and configured to couple to a heat source on a surface of the substrate. Many heat sources comprising semiconductor materials have a low CTE. Because the z axis 202 is the high expansion axis wherein the CTE is likely to be greater than the CTE of the heat source, aligning the z axis 202 along a surface of the heat source is likely to damage fragile components of the heat source due to the mechanical stress induced by CTE mismatch.

Figure 2B:
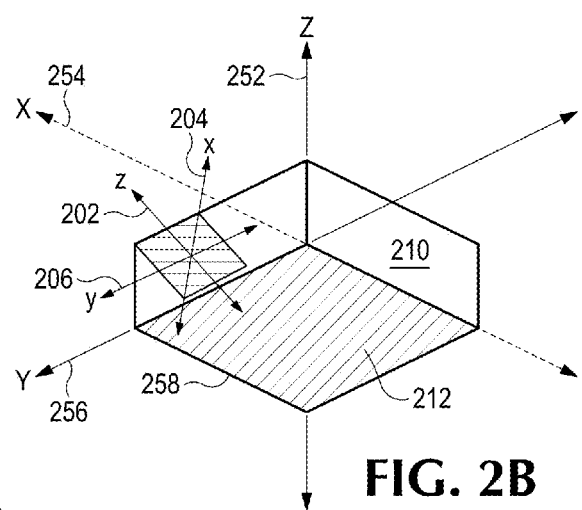
FIG. 2B illustrates an example of a submount formed from reoriented anisotropic material.

FIG. 2B depicts a submount 210 formed from reoriented anisotropic material 218. In an example, z axis 202 may be reoriented to form a submount 210 having a surface 212 oblique to z axis 202. The axes of submount 210 are Z axis 252, X axis 254 and Y axis 256. Surface 212 is in the X-Y plane 258. Z axis 252, X axis 254 and Y axis 256 are mutually orthogonal.

Reorienting z axis 202 enables submount 210 to preserve a significant portion of the high thermal conductivity of x axis 204 and/or y axis 206 at surface 212 while mitigating the high CTE of z axis 202. In an example, to reach an optimal orientation z axis 202 may be rotated one or more times with respect to various planes and/or axes of submount 210. As a result of reorienting z axis 202, Z axis 252 has a fourth CTE along Z axis 252, X axis 254 has a fifth CTE along X axis 254, and Y axis 256 has a sixth CTE along Y axis 256.

In an example, z axis 202 may be rotated through a first angle about a first axis of submount 210 and also rotated through a second angle about a second axis of submount 210. Doing so may improve heat dissipation and further optimize CTE match between a heat source and submount 210. When z axis 202 is rotated only about Y axis 256, Z axis 252 is oblique to z axis 202, X axis 254 is oblique to the x axis 204 and Y axis 256 is parallel to y axis 256. When z axis 202 is rotated about X axis 254 and Y axis 256, Z axis 252 is oblique to z axis 202, X axis 254 is oblique to the x axis 204 and Y axis 256 is oblique to y axis 206.

Figure 2C:
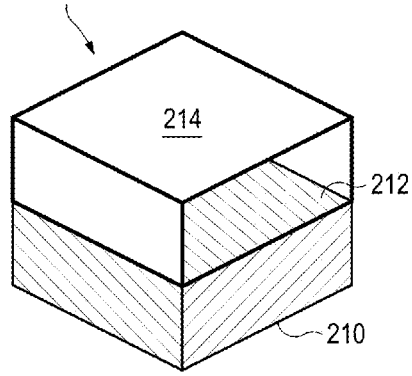
FIG. 2C illustrates an example assembly comprising a submount that is to be coupled to a heat source.

FIG. 2C illustrates an example of an assembly 200 comprising a submount 210 coupled to a heat source 214 at surface 212. Heat source 214 may comprise any of a variety of heat sources such as semiconductor devices including integrated circuits, diode lasers, LEDs, superluminescent light emitting diodes (SLEDs), solar cells, and the like, or any combinations thereof.

Referring again to FIG. 2B, one or more angles of rotation of z axis 202 about X axis 254, Y axis 256 and/or Z axis 252 may each be selected to optimize matching of the fourth, fifth and/or sixth CTE to a CTE of heat source 214. In this way, CTE mismatch will be reduced and thus mechanical stress in assembly 200 will also be reduced.

In an example, submount 210 may be optimized for thermal conductivity subordinate to optimizing CTE match by selecting one or more angles of rotation of z axis 202 about X axis 254, Y axis 256 and/or Z axis 252 (when z axis 202 is rotated about multiple angles of rotation) that optimizes thermal conductivity at surface 212 or through submount 210 as a secondary consideration to maximizing a match of the CTE of substrate 210 with the heat source 214.

Angles of rotation of z axis 202 about X axis 254, Y axis 256 and/or Z axis 252 may be selected to first optimize for CTE matching between heat source 214 and submount 210. The angles of rotation of z axis 202 about X axis 254, Y axis 256 and/or Z axis 252 may be modified to improve thermal conductivity of the axes in submount 210.

In one example, a CTE mismatch tolerance may be identified and a range of angles of rotation for z axis 202 within the CTE mismatch tolerance level may be determined. Angles of rotation of z axis 202 may be modified within the determined range of angles of rotation for z axis 202 about X axis 254, Y axis 256 and/or Z axis 252 to optimize for thermal conductivity of one or more axes of submount 210. In another example, z axis 202 may be rotated through one or more angles of rotation with respect to the X axis 254, Y axis 256 and/or Z axis 252 wherein the multiple angles of rotation are selected to optimize matching of the CTE with the heat source CTE subordinate to optimizing thermal conductivity at or through the submount 210.

In an example, the CTE mismatch tolerance may be selected such that a change in an angle of rotation of the z axis 202 about X axis 254, Y axis 256 and/or Z axis 252 does not result in a significant change in closeness of CTE match between the submount 210 and heat source 212. A "significant change" may be defined according to industry standards and/or on a case-by-case basis and may depend upon the application, materials, and/or other factors that have an impact on an assembly's ability to withstand CTE mismatch and/or mechanical strain.

In an example, heat source 214 may be anisotropic having different CTEs along various axes. Angles of rotation of z axis 202 about X axis 254, Y axis 256 and/or Z axis 252 may be selected to match the CTEs of the X axis 254, Y axis 256 and/or Z axis 252 of submount 210 with corresponding axes of heat source 214. Corresponding axes are the axes of heat source 214 that are to be aligned with the axes of submount 210.

EXAMPLE EMBODIMENTS

The following figures illustrate advanced heat transfer modeling of examples of an assembly comprising a submount to be coupled to a heat source. The heat transfer modeling was performed to evaluate the thermal performance of a Chip on Submount (COS) configuration wherein the anisotropic material is rotated once or twice with respect to one or more global axes of the submount. The following examples are meant to be illustrative of the disclosed technology and not limiting in any way.

Figure 3A:
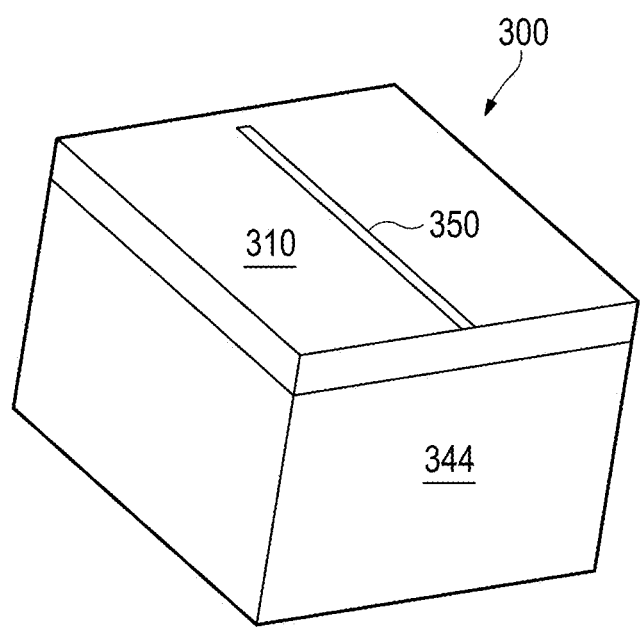
FIG. 3A illustrates an example of a laser diode heat source with dimensions of 0.1 mm×5.0 mm on a submount.

FIG. 3A illustrates an example assembly 300 comprising a submount 310 including a footprint 350 identifying an area of submount 310 that is to be coupled to a heat source (not shown) such as a laser diode. Footprint 350 is about 5.0 mm×0.1 mm. Submount 310 is about 0.5 mm thick. Submount 310 is coupled to a conductive surface of a heat transfer structure 344 which is about 3.0 mm thick. Heat transfer structure 344 may comprise one or more layers of isotropic and/or anisotropic materials.

Figure 3B:
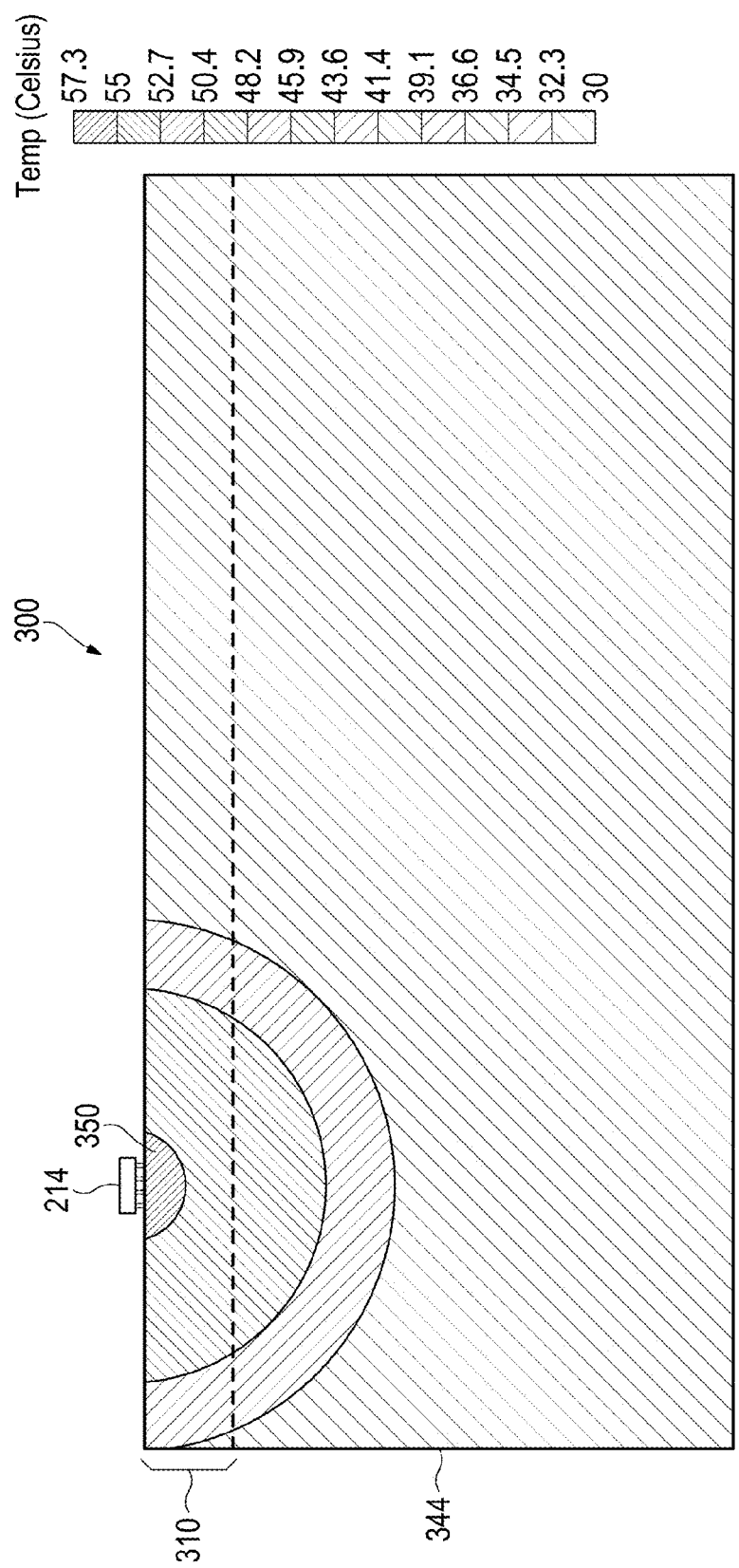
FIG. 3B illustrates an initial baseline temperature map of an assembly comprising a submount.

FIG. 3B illustrates an initial baseline temperature map of assembly 300 at an initial baseline temperature. In the baseline run, submount 310 is made with isotropic material with a conductivity of AlN. In this analysis, the maximum temperature indicated in footprint area 350 is about 57.0° C., which closely matches the experimental result obtained for the case with a heat sink temperature of 30° C.

Figure 4A:
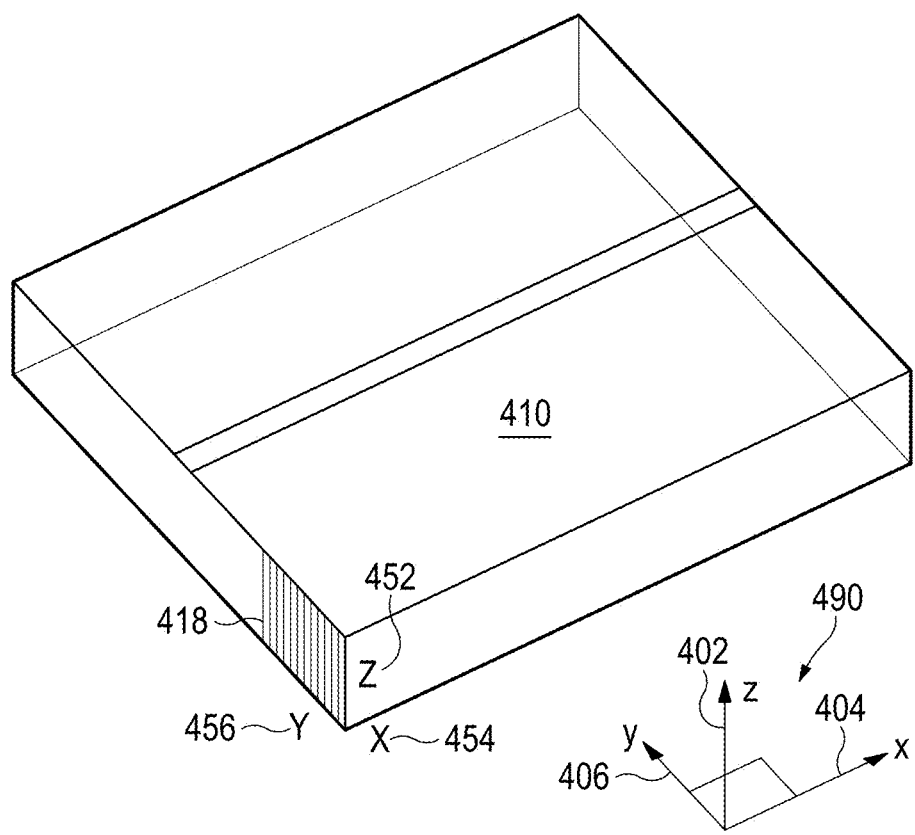
FIG. 4A illustrates an example of submount comprising pyrolytic graphite.
Figure 4B:
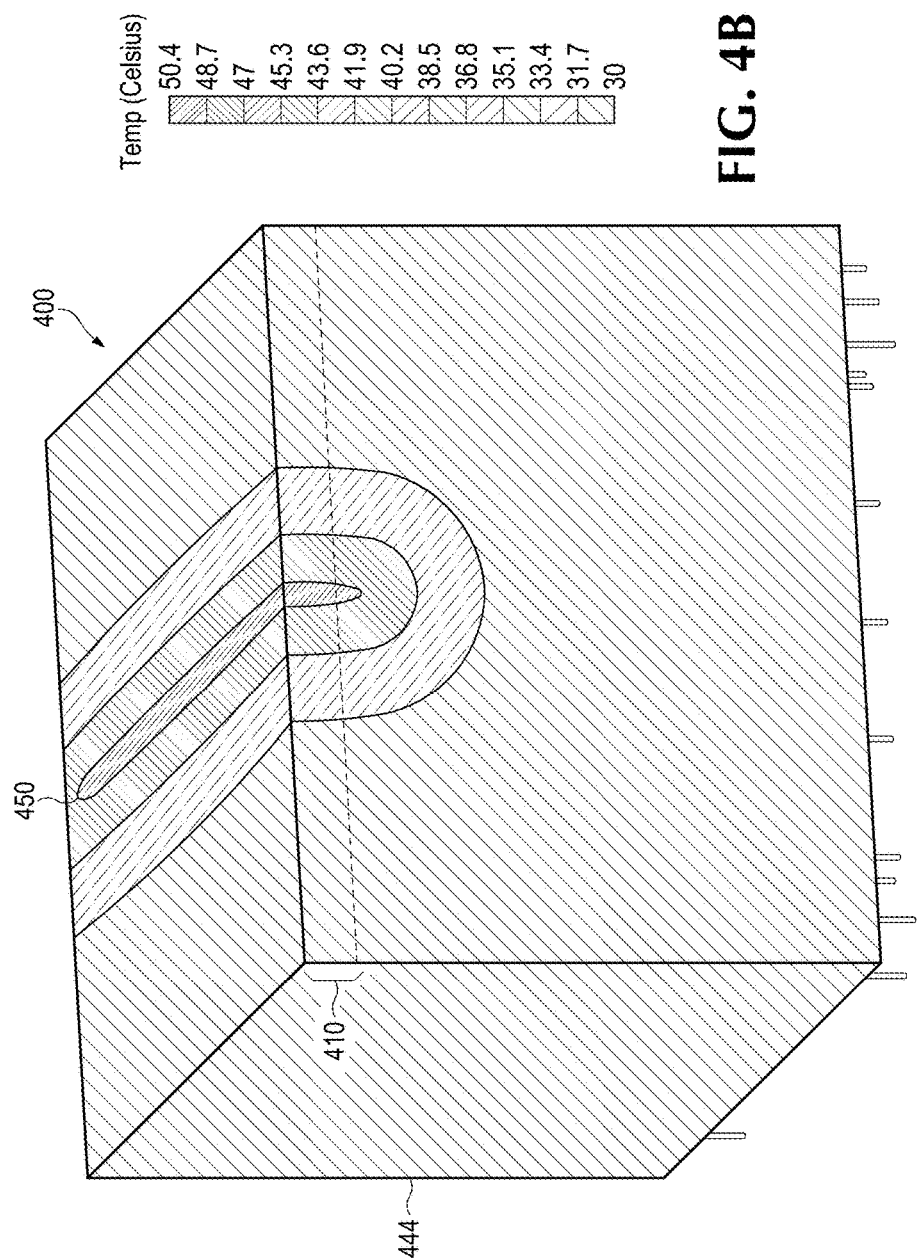
FIG. 4B illustrates temperature map of an assembly including a submount.

FIG. 4A illustrates an example of submount 410 comprising pyrolytic graphite 418. In an example, from an original orientation 490, pyrolytic graphite 418 is oriented with a high expansion axis (z axis 402) rotated 90° about the submount 410 Y axis 456. In other words, the material z-vector is oriented (1, 0, 0) with respect to global axes of the submount, Z axis 452, X axis 454 and Y axis 456. Thus, in FIG. 4A submount 410 has the following properties:
Thermal Conductivity:
 X axis 454=kX=7.0 W/m-K
 Y axis 456=kY=1700.0 W/m-K
 Z axis 452=kZ=1700.0 W/m-K
Coefficient of Linear Thermal Expansion (CTE):
 X axis 454=αX=2.5 e-5/K
 Y axis 456=αY=5.0 e-7/K
 Z axis 452=αZ=5.0 e-7/K FIG. 4B illustrates a temperature map of assembly 400. Submount 410 comprises pyrolytic graphite rotated as described with respect to FIG. 4A. The maximum temperature indicated in footprint area 450 is about 50.0°.

Figure 5A:
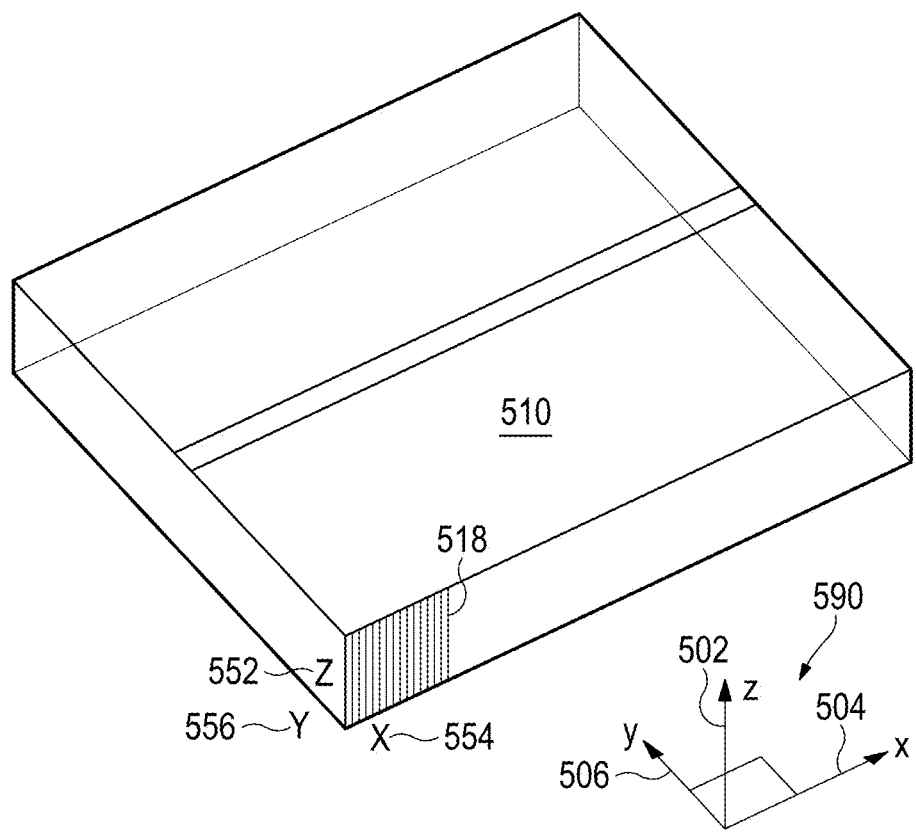
FIG. 5A illustrates an example of submount comprising pyrolytic graphite.
Figure 5B:
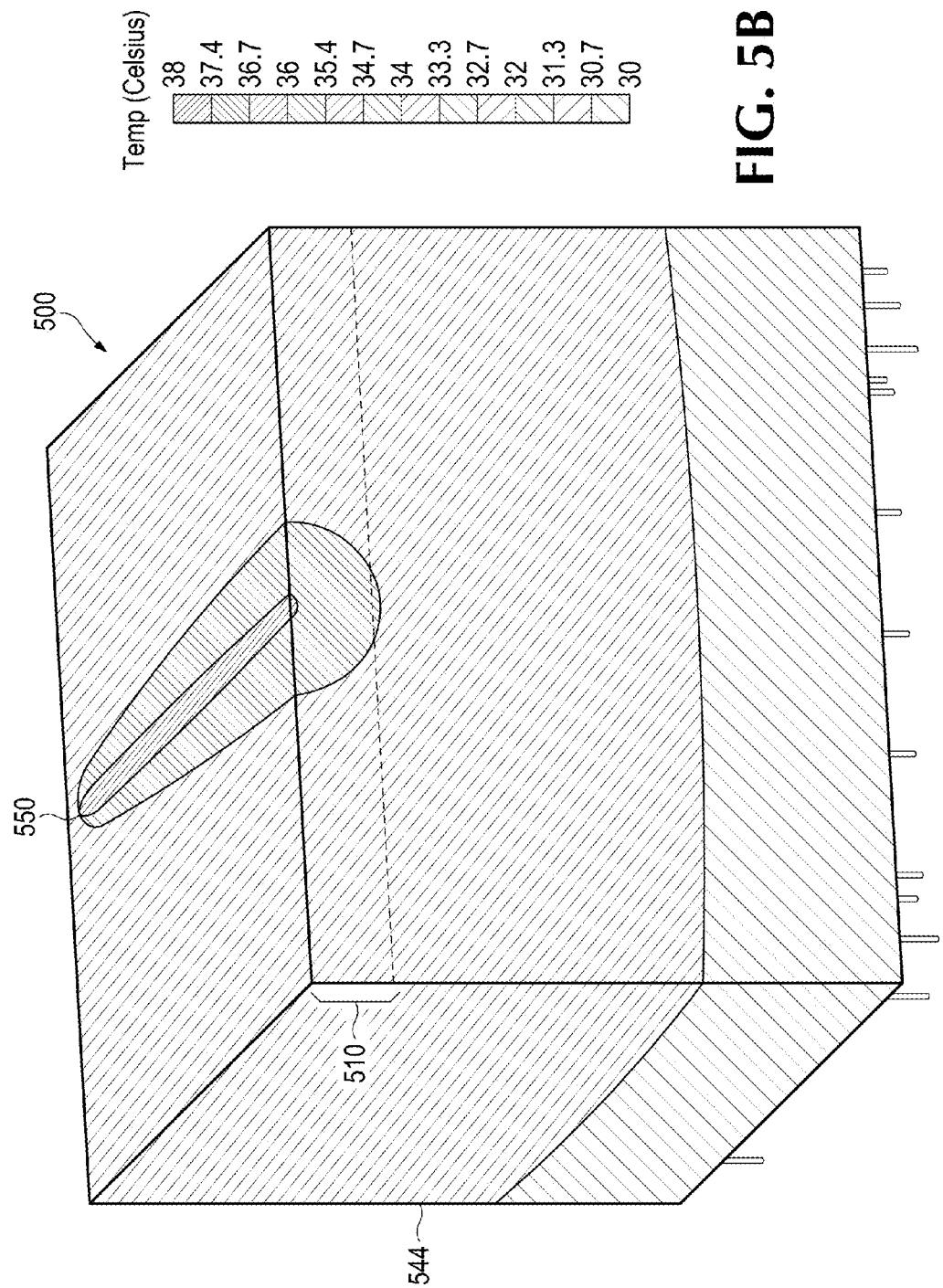
FIG. 5B illustrates temperature map of an assembly comprising a submount for a laser diode.

FIG. 5A illustrates an example of submount 510 comprising pyrolytic graphite 518. In an example, from an original orientation 590, pyrolytic graphite 518 is oriented with a high expansion axis (z axis 502) rotated 90° about the submount 510 X axis 554. In other words, the material z-vector is oriented (0,1,0) with respect to global axes of the submount 510, Z axis 552, X axis 554 and Y axis 556. Thus, in FIG. 5A submount 510 has the following properties:
Thermal Conductivity:
 X axis 554=kX=1700.0 W/m-K
 Y axis 556=kY=7.0 W/m-K
 Z axis 552=kZ=1700.0 W/m-K Coefficient of Linear Thermal Expansion (CTE):
X axis 554=αX=5.0 e-7/K
Y axis 556=αY=2.5 e-5/K
Z axis 552=αZ=5.0 e-7/K FIG. 5B illustrates a temperature map of assembly 500. Submount 510 comprises pyrolytic graphite rotated as described with respect to FIG. 5A. The maximum temperature indicated in footprint area 450 is about 38.0°.

Figure 6A:
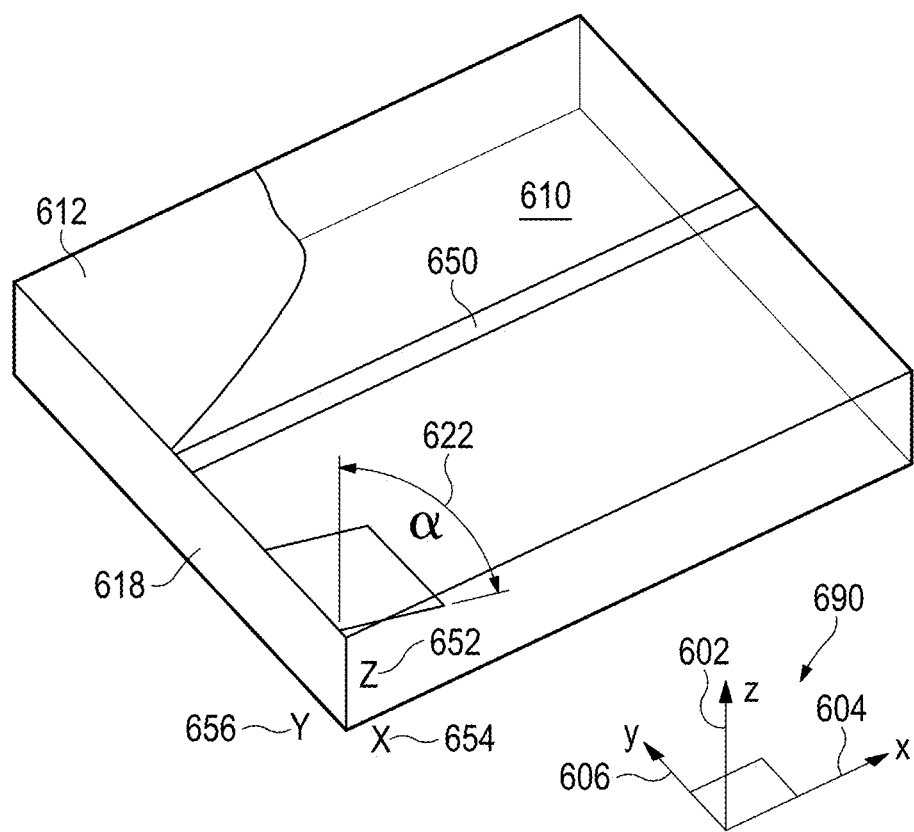
FIG. 6A illustrates an example of a submount comprising pyrolytic graphite rotated with respect to global axes of a submount.

FIG. 6A is a cutaway view illustrating an example of a submount 610 comprising pyrolytic graphite 618 rotated with respect to global axes X axis 654, Y axis 656 and/or Z axis 652. The pyrolytic graphite 618 is oriented such that the highest expansion axis, z axis 602, and one or more of x axis 604 or y axis 606 of the pyrolytic graphite 618 are oblique to a surface 612 of submount 610. Submount 610 is to be coupled to a heat source comprising gallium arsenide (GaAs). In an example, submount 610 may be formed by reorienting z axis 602 at an angle α 622 of 102.5° with respect to Z-axis 652 of submount 610. The angle of reorientation is selected to substantially match the CTE of submount 610 at surface 612 with the CTE of a GaAs heat source in the direction of X axis 654.

Reorienting the pyrolytic graphite 618 in this way impacts both the CTE and thermal conductivity through Z axis 652 and X axis 654 of submount 610. In this example, the thermal conductivity of the X axis 654 is about 1033.0 W/m-K and 374.0 W/m-K in the Z axis 652. Thermal conductivity through Y axis 656 remains high at 1700.0 W/m-K. The CTE of the Z axis 652 is 2.44 E-5/° C. and X axis 654 is 5.4 E-6/° C. while the CTE of Y axis 656 is 5.0 E-7/° C. In an example, where the heat source is a laser diode, a laser optical axis in footprint 650 may coincide with X axis 654. Reducing CTE mismatch in this direction will reduce mechanical stress on the laser diode optical axis in footprint 650.

Figure 6B:
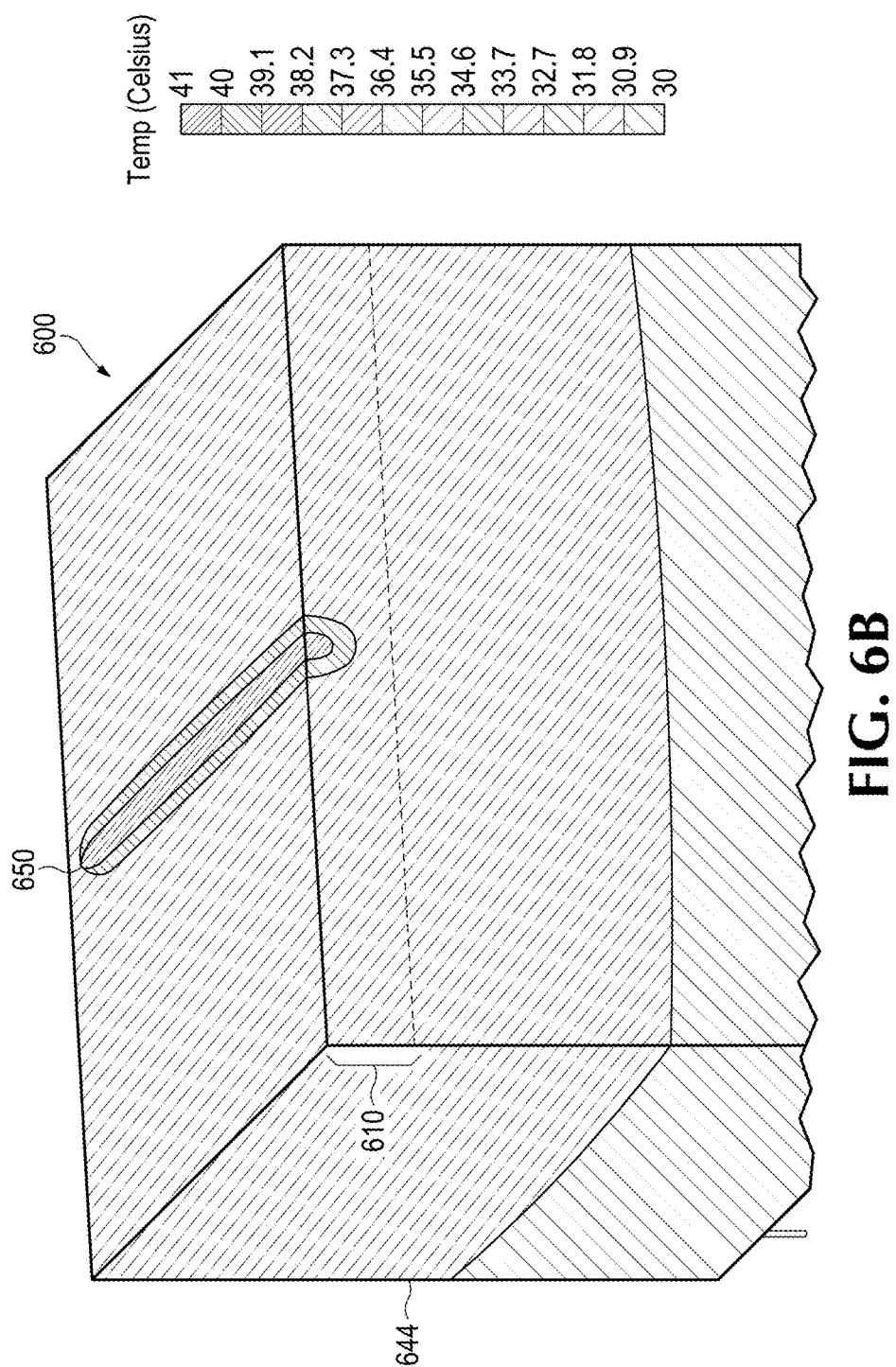
FIG. 6B illustrates a temperature map of an assembly comprising a submount.

FIG. 6B illustrates a temperature map of an assembly 600 comprising submount 610. Footprint 650 identifies an area of submount 610 that is to be coupled to a GaAs heat source. Submount 610 is coupled to a surface of a heat transfer structure 644. Heat transfer structure 644 may comprise one or more layers of isotropic and/or anisotropic material. The temperature map of FIG. 4B illustrates a simulated temperature rise in the GaAs heat source at about 16.0 W of heat dissipation from the heat source. The temperature rise is approximately 40.0° C. In contrast, using an AlN submount rather than the anisotropic submount produces a temperature rise of approximately 57.0° C.

Figure 7A:
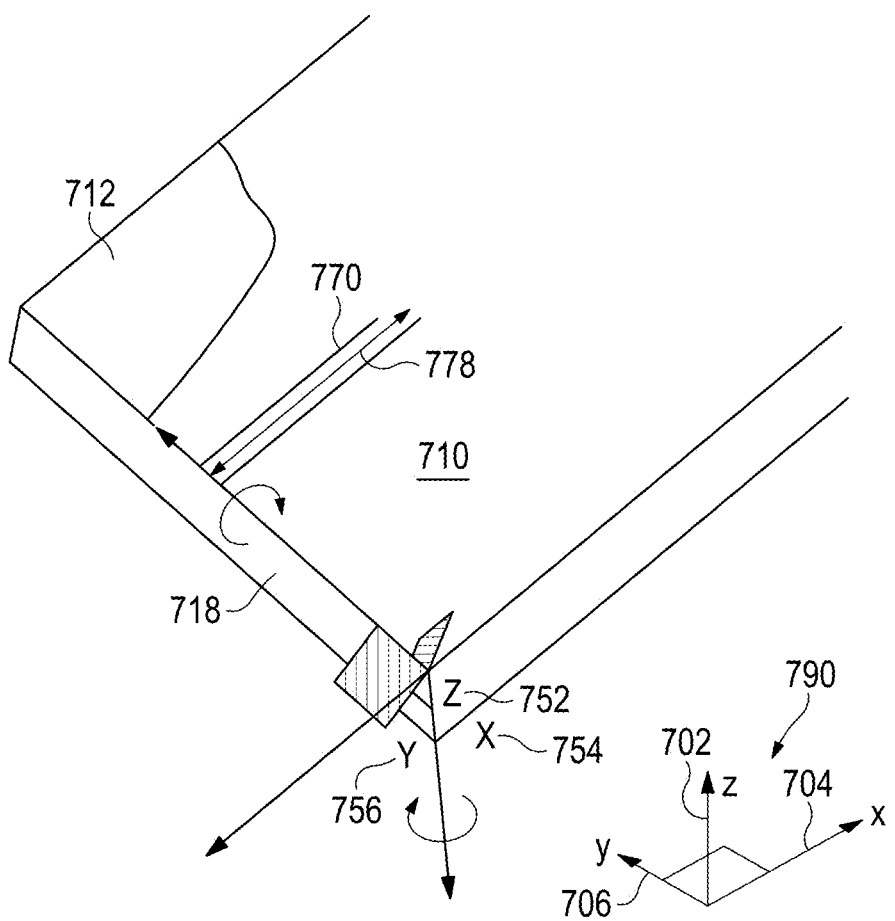
FIG. 7A illustrates an example of a submount formed from pyrolytic graphite rotated in two directions with respect to global axes of a submount.

FIG. 7A illustrates an example of a submount 710 formed from pyrolytic graphite 718 rotated in two directions with respect to global axes of submount 710. Submount 710 has axes, Z axis 752, X axis 754 and Y axis 756. Submount 710 includes a surface 712 and a footprint 750 identifying an area to be coupled to a laser diode. The laser diode would lase along the length 758 of footprint 750.

In an example, the pyrolytic graphite 718 is oriented such that the highest expansion axis, z axis 702, and one or more of x axis 704 or y axis 706 are oblique to surface 712. The z axis 702 of anisotropic material 718 is rotated first about Z axis 752 by about 153.2° and is then rotated about the Y axis 756 by about 153.2°. This dual rotation achieves a desired CTE in the lasing optical axis along length 758. It can be shown mathematically that for equal rotations of about 153.2° about Z axis 752 and Y axis 756 the thermal conductivity of pyrolytic graphite 718 becomes essentially isotropic with respect to the global axes Z axis 752, X axis 754 and Y axis 756 of submount 710, with a thermal conductivity of approximately 790 W/m-K. As above, the CTE in the X axis 754 direction is still 5.4E-6/° C., but in this case the CTE of the Y axis 756 is 22.4E-6/° C.

FIG. 7B illustrates a simulated temperature rise of an assembly 700 comprising submount 710 coupled to a heat source (not shown). Assembly 700 includes heat source footprint 750 which identifies an area of submount 702 that is to be coupled to the heat source (e.g., a laser diode). Submount 710 is coupled to a surface of a heat transfer structure 744. The simulated temperature rise assumes a heat source at 16 W of heat dissipation and projects an approximately 40° C. temperature rise using submount 710.

Figure 8:
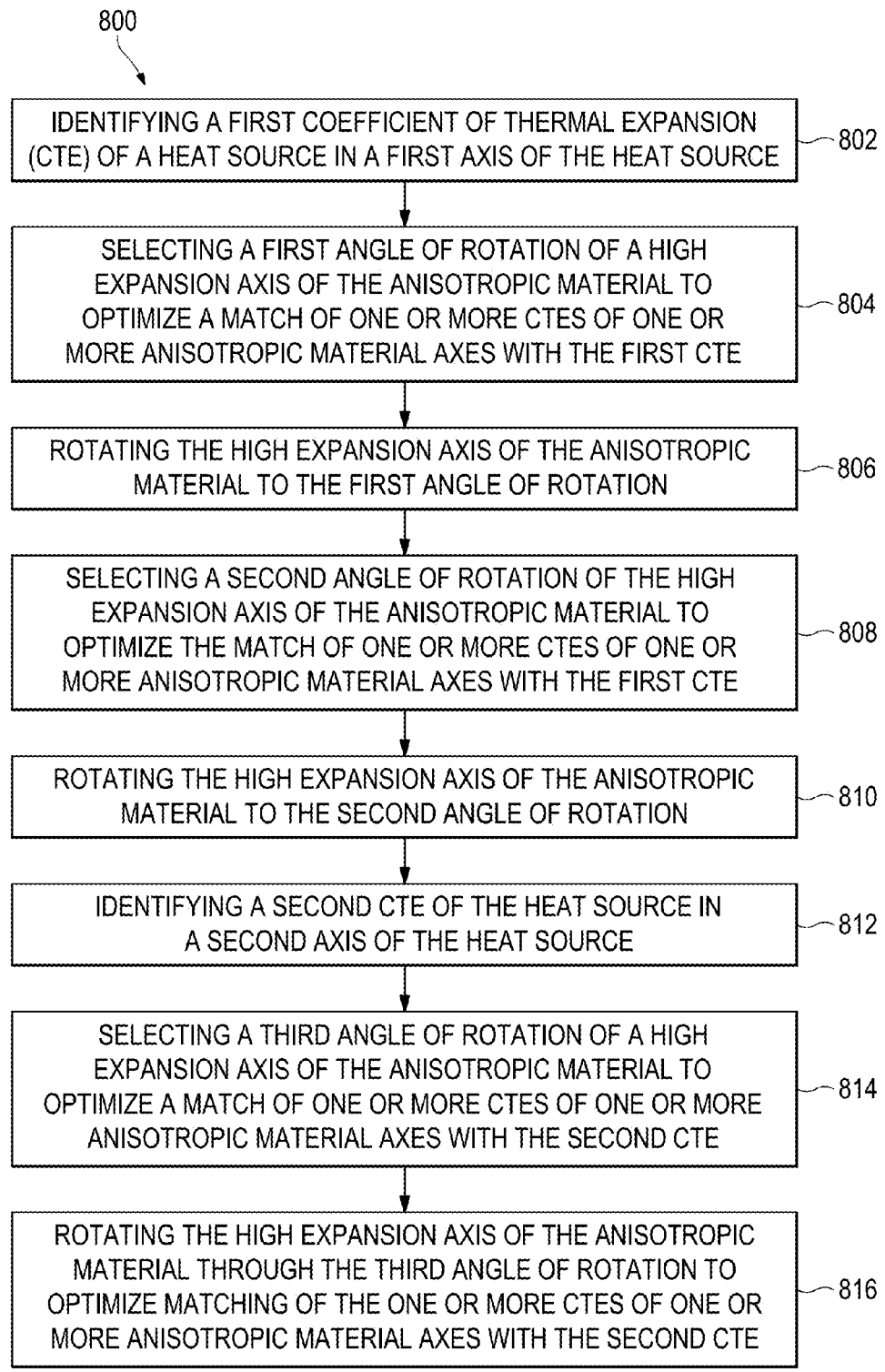
FIG. 8 illustrates a process to form a submount from an anisotropic material.

FIG. 8 illustrates a process 800 to form a submount 210 from an anisotropic material 218 by orienting a highest expansion axis 204 of the anisotropic material 218 with respect to the axes of submount 210 such that the high expansion axis (z axis 202) is oblique to a surface 212 of submount 210. Process 800 begins at block 802 where a first coefficient of thermal expansion (CTE) of a heat source 214 is identified in a first axis of the heat source to be coupled to a heat spreader 210 comprising an anisotropic material 218. Process 800 may proceed to block 804 where a first angle of rotation of a high expansion axis (z axis 202) of the anisotropic material 218 may be selected to optimize a match of one or more CTEs of one or more anisotropic material axes (z axis 202, x axis 204 and/or y axis 206) with the first CTE wherein the angle is with respect to a first axis (Z axis 252) of the heat spreader 210. At block 806, the high expansion axis of the anisotropic material may be rotated to the first angle. At block 808, a second angle of rotation of the high expansion axis (z axis 202) of the anisotropic material may be selected to optimize the match of one or more CTEs of one or more anisotropic material axes (z axis 202, x axis 204 and/or y axis 206) with the first CTE wherein the angle is with respect to a second axis (Y axis 256) of the heat spreader 210. At block 810, the high expansion axis of the anisotropic material may be rotated to the second angle of rotation. At block 812, a second CTE of the heat source in a second axis of the heat source may be identified. Either of the first or second angles of rotation may be selected to also optimize the match of one or more CTEs of one or more anisotropic material axes (z axis 202, x axis 204 and/or y axis 206) with the second CTE. At block 814, a third angle of rotation of the high expansion axis (z axis 202) of the anisotropic material may be selected to optimize the match of one or more CTEs of one or more anisotropic material axes (z axis 202, x axis 204 and/or y axis 206) with the second. At block 816, the high expansion axis of the anisotropic material may be rotated through the third angle of rotation to optimize matching of the one or more CTEs of one or more anisotropic material axes with the second CTE. The first, second and/or third angles of rotation may be selected to optimize thermal conductivity along one or more axes of the heat spreader subordinate to optimizing the match of the one or more CTEs of one or more anisotropic material axes with the first CTE and/or second CTE.

Although process 800 has been described as having several steps, it is not necessary for all of the steps of the process to be performed nor is there a particular order in which the steps are to be practiced within the scope of the contemplated subject matter. Furthermore, unidentified intervening steps may contemplated and practiced within the scope of the presently disclosed technology.

Having described and illustrated the general and specific principles of examples of the presently disclosed technology, it should be apparent that the examples may be modified in arrangement and detail without departing from such principles. We claim all modifications and variation coming within the spirit and scope of the following claims.

The invention claimed is:

1. An apparatus comprising:
a heat spreader having a heat source coefficient of thermal expansion (HS CTE), the heat spreader comprising an anisotropic material having a high expansion axis and a low expansion axis oblique to the high expansion axis;
a surface of the heat spreader configured to couple to a heat source, wherein the high expansion axis of the anisotropic material is oblique to the surface of the heat spreader and wherein the high expansion axis of the anisotropic material is oriented at a first angle of rotation about a first axis of the heat spreader wherein the first angle of rotation is selected to optimize a match of a first CTE of the heat spreader with the HS CTE.

2. The apparatus of claim 1, wherein the high expansion axis of the anisotopic material is oriented at a second angle of rotation about a second axis of the heat spreader wherein the second angle of rotation is selected to optimize the match of the first CTE of the heat spreader with the HS CTE.

3. The apparatus of claim 2, wherein the anisotropic material is oriented within the heat spreader such that high expansion axis is rotated through a third angle of rotation about a third axis of the heat spreader wherein the third angle of rotation is selected to optimize the match of the first CTE of the heat spreader with the HS CTE.

4. The apparatus of claim 3, wherein the first angle of rotation, the second angle of rotation or the third angle of rotation or a combination thereof optimizes thermal conductivity of the heat spreader subordinate to optimizing the match of the first CTE of the heat spreader with the HS CTE.

5. The apparatus of claim 4, wherein the first angle of rotation, the second angle of rotation or the third angle of rotation or a combination thereof optimizes a match of the first CTE or a second CTE of the heat spreader with respective ones of a first CTE along a first HS axis of the heat source or a second CTE along a second HS axis of the heat source or a combination thereof.

6. The apparatus of claim 5, wherein the first angle of rotation, the second angle of rotation or the third angle of rotation or a combination thereof optimizes thermal conductivity of the heat spreader subordinate to matching the first CTE along a first HS axis of the heat source or a second CTE along a second HS axis of the heat source or a combination thereof.

7. The apparatus of claim 1, wherein the anisotropic material comprises at least one of silicon carbide (SiC), copper (Cu), cubic boron nitride (c-BN), graphite, graphene, graphene-composites, carbon nanotubes, carbon nanotube composites, diamond and pyrolytic graphite.

8. The apparatus of claim 1, wherein the heat spreader is coupled to the heat source at the surface and a heat sink at a surface opposite the heat source.

9. A system comprising:
a heat source having a coefficient of thermal expansion (CTE);
a heat spreader to be coupled to the heat source comprising an anisotropic material wherein the anisotropic material includes:
a primary axis having a primary coefficient of thermal expansion (CTE) along the primary axis, wherein the primary CTE is a highest CTE in the anisotropic material;
a secondary axis having a secondary CTE along the secondary axis, wherein the secondary axis is orthogonal to the primary axis and wherein the primary CTE is different from the secondary CTE; and
a tertiary axis having a tertiary CTE along the tertiary axis, wherein the tertiary axis is orthogonal to the secondary axis and the primary axis; and
a surface of the heat spreader in contact with the heat source, the surface oriented in a plane oblique to the primary axis, the heat spreader having:
a quaternary axis orthogonal to the oblique plane having a quaternary CTE along the quaternary axis;
a quinary axis in the oblique plane having a quinary CTE along the quinary axis; and
a senary axis in the oblique plane having a senary CTE along the senary axis,
wherein the anisotropic material is oriented within the heat spreader such that the primary axis is rotated at a first angle of rotation with respect to the quaternary axis about the quinary axis and wherein the first angle of rotation optimizes a match of the quaternary CTE, quinary CTE or senary CTE or any combinations thereof with a CTE of the heat source.

10. The system of claim 9, wherein the first angle of rotation optimizes thermal conductivity along the quaternary axis, quinary axis or senary axis, or any combinations thereof subordinate to optimizing the match of the quaternary CTE, quinary CTE or senary CTE or any combinations thereof with the CTE of the heat source.

11. The system of claim 9, wherein the anisotropic material is oriented within the heat spreader such that the primary axis is rotated through a second angle of rotation with respect to the quinary axis about the senary axis and wherein the second angle of rotation optimizes the match of the quaternary CTE, quinary CTE or senary CTE or any combinations thereof with a CTE of the heat source.

12. The system of claim 11, wherein the second angle of rotation optimizes thermal conductivity along the quaternary axis, quinary axis or senary axis, or any combinations thereof subordinate to optimizing the match of the quaternary CTE, quinary CTE or senary CTE or any combinations thereof with the CTE of the heat source.

13. The system of claim 11, wherein the anisotropic material is oriented within the heat spreader such that the primary axis is rotated through a third angle of rotation with respect to the senary axis about the quaternary axis and wherein the third angle of rotation optimizes the match of the quaternary CTE, quinary CTE or senary CTE or any combinations thereof with a CTE of the heat source.

14. The system of claim 13, wherein the third angle of rotation optimizes thermal conductivity along the quaternary axis, quinary axis or senary axis, or any combinations thereof subordinate to optimizing the match of the quaternary CTE, quinary CTE or senary CTE or any combinations thereof with the CTE of the heat source.

15. The system of claim 13, where the heat source is a laser diode, integrated circuit or a light emitting diode, or any combinations thereof.

16. The system of claim 9, wherein the tertiary CTE is different from the primary CTE and the secondary CTE.

17. The system of claim 9, wherein the anisotropic material comprises at least one of silicon carbide (SiC), copper (Cu), cubic boron nitride (c-BN), graphite, graphene, graphene-composites, carbon nanotubes, carbon nanotube composites, diamond and encapsulated pyrolytic graphite.

18. A method comprising:
identifying a first coefficient of thermal expansion (CTE) of a heat source in a first axis of the heat source to be coupled to a heat spreader comprising an anisotropic material having a high expansion axis and a low expansion axis oblique to the high expansion axis;
selecting a first angle of rotation of the high expansion axis of the anisotropic material to optimize a match of one or more CTEs of one or more anisotropic material axes with the first CTE wherein the angle is with respect to a first axis of the heat spreader; and
rotating the high expansion axis of the anisotropic material to the first angle of rotation.

19. The method of claim 18, further comprising:
selecting a second angle of rotation of the high expansion axis of the anisotropic material to optimize the match of one or more CTEs of one or more anisotropic material axes with the first CTE wherein the angle is with respect to a second axis of the heat spreader; and
rotating the high expansion axis of the anisotropic material to the second angle of rotation.

20. The method of claim 18, further comprising:
identifying a second CTE of the heat source in a second axis of the heat source;
rotating the high expansion axis of the anisotropic material through a second angle of rotation to optimize matching of the one or more CTEs of one or more anisotropic material axes with the second CTE.

21. The method of claim 18, further comprising selecting the first angle of rotation to optimize thermal conductivity along one or more axes of the heat spreader subordinate to optimizing the match of the one or more CTEs of one or more anisotropic material axes with the first CTE.

* * * * *